(12) United States Patent
Mukaihara et al.

(10) Patent No.: US 6,545,296 B1
(45) Date of Patent: Apr. 8, 2003

(54) SEMICONDUCTOR LIGHT EMITTING DEVICE

(75) Inventors: Toshikazu Mukaihara, Tokyo (JP); Takeharu Yamaguchi, Tokyo (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/512,245

(22) Filed: Feb. 24, 2000

(30) Foreign Application Priority Data

Feb. 26, 1999 (JP) .............................. 11-049446

(51) Int. Cl.$^7$ .................................................. H01L 33/00
(52) U.S. Cl. .............................. 257/79; 257/95; 257/96; 257/98; 372/43
(58) Field of Search .............................. 257/94, 95, 96, 257/98, 43, 45, 46; 372/43, 44, 45, 46

(56) References Cited

U.S. PATENT DOCUMENTS 5,814,839 A * 9/1998 Hosoba ........................ 257/96

FOREIGN PATENT DOCUMENTS

JP 09213477 A * 8/1997

* cited by examiner

*Primary Examiner*—Fetsum Abraham
*Assistant Examiner*—Leonard Andujar
(74) *Attorney, Agent, or Firm*—Katten Muchin Zavis Rosenman

(57) ABSTRACT

A semiconductor light emitting device including a semiconductor substrate and an active layer having band gap energy smaller than that of the active layer, and the bottom surface of the semiconductor substrate opposite to the active layer is a photo diffused reflection surface having unevenness. The unevenness reduces an amount of reflection rays to enable the stable operation.

7 Claims, 6 Drawing Sheets

US 6,545,296 B1

SEMICONDUCTOR LIGHT EMITTING DEVICE

BACKGROUND OF THE INVENTION (a) Field of the Invention

The present invention relates to a semiconductor light emitting device, more in detail, to the semiconductor light emitting device in which an optical output and a lasing spectrum have a stable relation with respect to injected current, and more specifically to the high power semiconductor pumping source, such as a semiconductor laser, which is most suitable as an optical amplifier for an optical communication system.

(b) Description of the Related Art

A semiconductor light emitting device outputting a light having a wavelength of a 980 nm band, for example, an InGaAs-based semiconductor laser element is frequently employed as various light sources in an optical communication system, for example, as a pumping light source for an optical fiber amplifier.

The structure of the conventional InGaAs-based laser element of the 980 nm range (hereinafter referred to as "InGaAs-based laser element") will be described referring to FIG. 1.

A conventional InGaAs-based laser element 20 basically has a layered structure shown in FIG. 1 which is manufactured by sequentially depositing, by means of epitaxial growth, a n-AlGaAs cladding layer 12 having a thickness of 2 μm, quantum well active layers 13 including InGaAs films having a thickness of 7 nm and GaAs films having a thickness of 10 nm, a p-AlGaAs cladding layer 14 having a thickness of 2 μm and a GaAs cap layer 15 having a thickness of 0.3 μm, on an n-GaAs substrate 11 having a thickness of 100 μm.

The top portion of the cladding layer 14 and the cap layer 15 are subjected to an etching to form a mesa-stripe. A passivation film 16 made of SiN is formed on the entire surface other than the top surface of the cap layer 15 to make a window for supplying current therethrough.

A TiPtAu metal layered film 17 is formed on the passivation film 16 and the top surface of the cap layer 15 as a p-side electrode, and an AuGeNiAu metal layered film 18 is formed on the bottom surface of the substrate 11 as an n-side electrode.

Then, a conventional method for manufacturing the InGaAs-based laser element 20 shown in FIG. 1 will be described referring to FIG. 2 showing a vertical section of the laser element 20 during the manufacture.

At first, the n-AlGaAs cladding layer 12 having a thickness of 2 μm, the quantum well active layers 13 including InGaAs films having a thickness of 7 nm and GaAs films having a thickness of 10 nm, the p-AlGaAs cladding layer 14 having a thickness of 2 μm and the GaAs cap layer 15 having a thickness of 0.3 μm are sequentially formed on the n-GaAs substrate 11 by using an MOCVD method.

Then, the cap layer 15 and the upper portion of the cladding layer 14 are selectively etched by a thickness of 1 μm to form a mesa stripe, followed by formation of the passivation film 16 on the entire surface of the mesa stripe. The passivation film on the top surface of the mesa stripe is removed to form a window through which current is to be injected.

Then, the bottom surface of the substrate 11 is polished until the thickness of the substrate becomes 100 μm.

Thereafter, the TiPtAu metal layered film 17 functioning as a p-side electrode and the AuGe/Ni/Au metal layered film 18 functioning as a n-side electrode are formed on the passivation film 16 and on the bottom surface of the substrate 11, respectively, by means of vapor deposition to provide the InGaAs-based laser element 20.

Since the bandgap energy $Eg_1$ of the substrate 11 of the conventional InGaAs-based laser element 20 is 1.41 electron volts (eV) and the bandgap energy $Eg_2$ of the active layers 13 is 1.27 electron volts which is smaller than the bandgap energy $Eg_1$, the light emitted from the active layer can travel within the substrate.

However, the conventional InGaAs-based laser element has the following two problems in connection with the characteristics of the laser element.

A first problem is that a linearity between current and an optical output is not excellent and kinks are observed in the current-optical output characteristic as shown in FIG. 3 wherein the wavelength and the optical output power are plotted on abscissa and ordinate, respectively. The disturbance on the current-optical output characteristic makes it difficult to obtain a stable automatic power control (APC) for the InGaAs-based laser element based on the current-optical output characteristic.

A second problem is that a ripple appears at a specified wavelength interval, for example, a 3 nm interval on the wavelength characteristic of a lasing spectrum as shown FIG. 4. In this situation, a phenomenon occurs in which the lasing mode skips every 3 nm interval with respect to the injected current, and mode hopping noise is generated.

Accordingly, it is difficult to amplify the input signals simultaneously to keep the signal powers constant using, the conventional InGaAs-based laser element used for pumping source in an optical amplifier.

This disadvantage of the semiconductor light emitting device is extremely undesirable used for the pumping source of an optical fiber telecommunication system.

The present inventors have found the following matters after investigating the reasons of causing the above problems of the InGaAs-based laser element.

Either problem is generated because light is regularly reflected on the bottom surface of the substrate. Since the bottom surface of the substrate is of a mirror surface after the substrate is polished at the bottom surface to have a specified thickness, for example, to a thickness of 100 μm, part of the light travelling within the substrate and reflected on the bottom surface of the substrate is coupled with the light in the active layer 13 as shown in FIG. 5, and a coupled cavity is formed by combination of a substrate resonator formed by the regular reflection on the substrate and an original Fabry-Perot resonator, to thereby make the lasing wavelength unstable.

SUMMARY OF THE INVENTION

In view of the foregoing, an object of the present invention is to provide a semiconductor light emitting device such as a semiconductor laser element which can obtain a multiple longitudinal mode lasing spectrum generating reduced ripples and a stable optical output with respect to injected current.

The present invention provides a semiconductor light emitting device including a semiconductor substrate having a bandgap energy of $Eg_1$, and at least one active layer having a bandgap energy of $Eg_2$ smaller than $Eg_1$ and overlying main surface of the semiconductor substrate, a bottom surface of the semiconductor substrate opposite to the main surface having unevenness for diffused reflection.

In accordance with the present invention, the generation of kinks in the current-optical output characteristic and of ripples in the lasing spectrum occurring in a conventional semiconductor light emitting device can be substantially suppressed. Further, a semiconductor light emitting device can be provided in which an optical output and a multiple longitudinal mode lasing spectrum stably operate with regard to injected current by reducing an amount of light reflecting from the semiconductor substrate bottom surface to the active layer by means of making the minute unevenness on the semiconductor substrate bottom surface. Accordingly, the most appropriate high power pumping source for an optical amplifier of an optical fiber telecommunication system can be obtained.

The above and other objects, features and advantages of the present invention will be more apparent from the following description.

PREFERRED EMBODIMENTS OF THE INVENTION

Figure 1:
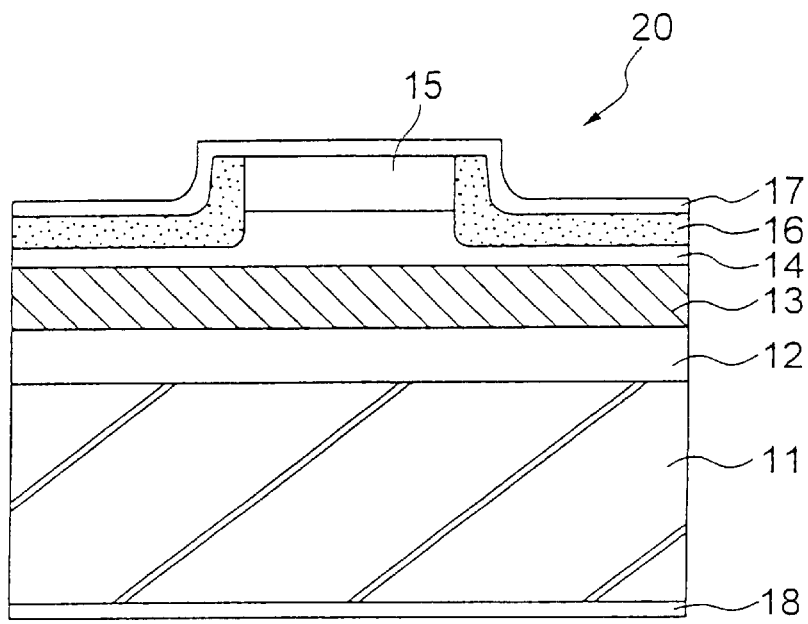
FIG. 1 is a cross sectional view showing a conventional InGaAs-based ridge waveguide laser element.
Figure 2:
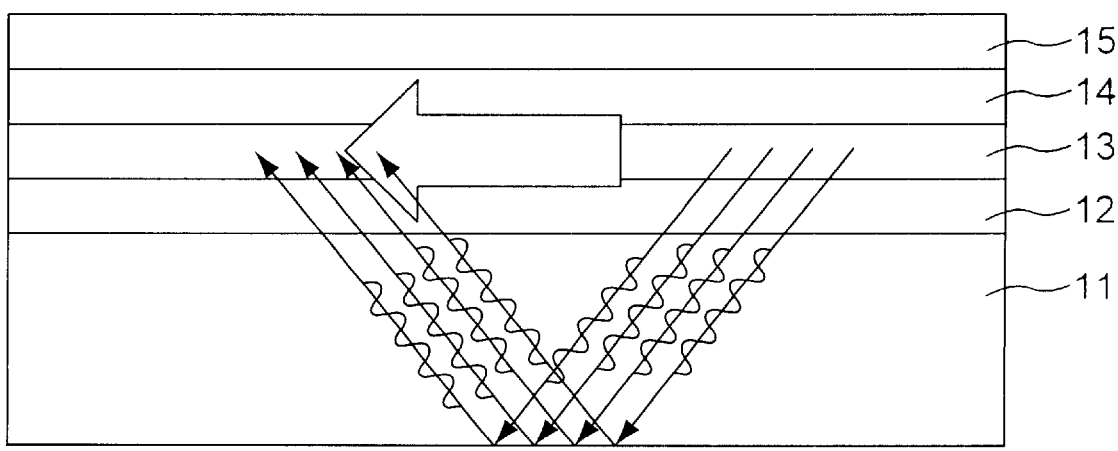
FIG. 2 is a vertical sectional along the laser cavity view showing a layered structure during manufacture of the conventional InGaAs-based laser element of FIG. 1.
Figure 3:
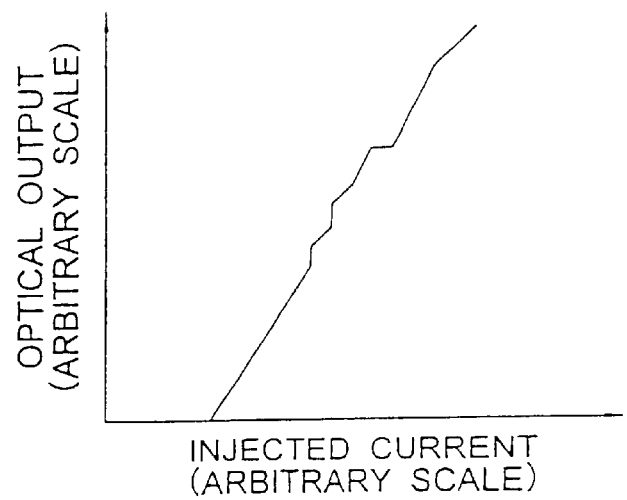
FIG. 3 is a graph showing a relation between injected current and an optical output of the conventional laser element.
Figure 4:
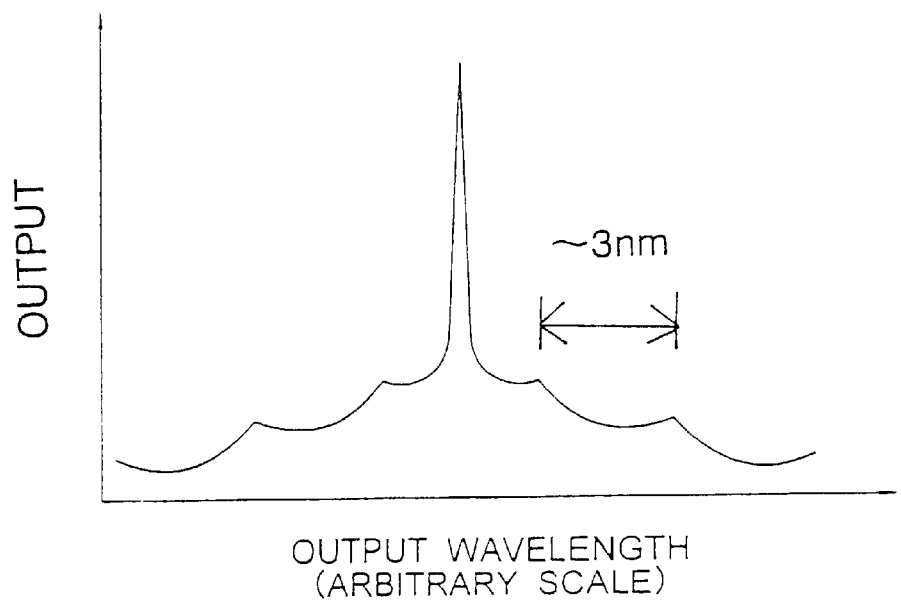
FIG. 4 is a graph showing an output spectrum of the conventional laser element.
Figure 5:
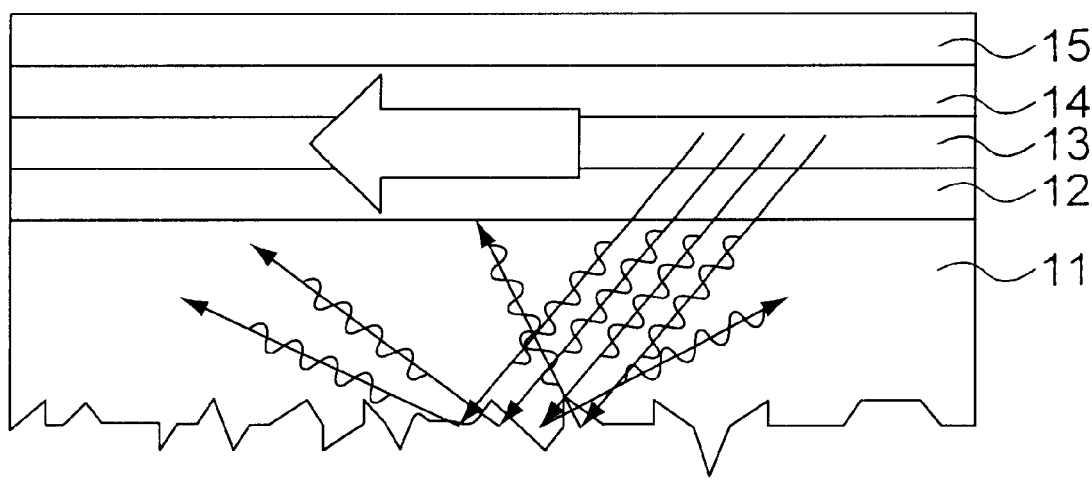
FIG. 5 is a schematic view showing a state in which a light is regularly reflected at a bottom surface of a substrate and combined with another light.

As far as the bandgap energy of the semiconductor substrate is larger than that of the active layer, the present invention can be applied to an in-plane semiconductor light emitting device and to a surface emission semiconductor light emitting device, and can be also applied to, for example, GaAs-based, InGaAs-based and InP-based semiconductor light emitting devices regardless of compositions of the semiconductor substrate and the active layer.

The size of the unevenness of the bottom surface of the semiconductor substrate should be determined depending on the wavelength of the semiconductor light emitting device, but can be defined by surface roughness Rq (root-mean square value of roughness). The surface roughness Rq may be between 10 nm and 10 μm both inclusive. The surface roughness Rq can be measured with a contact type or a light wave interference type surface roughness measuring device or an atomic force microscope (AFM)

The surface roughness Rq used herein is a root of an average value obtained by integrating the square of a deviation from a central line to a roughness curve f(x) in an evaluation length of 1 m followed by averaging as shown in the following equation.

$$Rq = \sqrt{\frac{1}{1m}\int_0^{1m} f(x)^2 dx}$$

The lasing spectrum of the conventional semiconductor light emitting device is unstable with respect to a returning light because of the single longitudinal mode operation.

However, the unevenness of the polished bottom surface extinguishes the ripples to realize the multiple longitudinal mode semiconductor light emitting device in the present invention, In order to realize the further stabilized multiple longitudinal mode lasing, a single quantum well structure including InGaAs/GaAs is desirably employed.

The reason thereof is as follows.

A degree of easing the occurrence of the single longitudinal mode lasing is defined as the below equation, and related with a spontaneous emission coefficient $\beta_{SP}$ showing a degree of contribution of spontaneous emission to a laser mode. The single longitudinal mode lasing is more easily generated with the decrease of the spontaneous emission coefficient $\beta_{SP}$, and the multiple longitudinal mode lasing is more easily generated with the increase of $\beta_{SP}$.

$$\beta_{SP} = (\Gamma \lambda^4 K)/(4\pi^2 n^3 V \delta \lambda)$$

Wherein $\Gamma$ is a confinement coefficient of light in the active layer, $\lambda$ is a lasing wavelength, K is a factor reflecting complexity of a horizontal mode, "n" is an equivalent refractive index, V is a volume of an active layer, and $\delta \lambda$ is a spread of a spectrum.

Accordingly, $\beta_{SP}$ is increased by decreasing the volume of the active layer "V" by means of employing a single quantum well as the active layer to generate the multiple longitudinal mode lasing.

Now, the present invention is more specifically described with reference to accompanying drawings.

A semiconductor light emitting device 200 in accordance with the present embodiment is an InGaAs-based in-plane emitting laser element. The light emitting device has a layered structure shown in FIG. 6A which is manufactured by sequentially depositing, by means of epitaxial growth, a n-AlGaAs cladding layer 110 having a thickness of 2 μm, an InGaAs (thickness of 7 nm)/GaAs (thickness of 10 nm) quantum well active layer 120 having band gap energy of 1.27 electron volts, a p-AlGaAs cladding layer 130 having a thickness of 2 μm and a GaAs cap layer 140 having a thickness of 0.3 μm, on a n-GaAs substrate 100 having a thickness of 100 μm and having band gap energy of 1.41 electron volts.

Figure 6A:
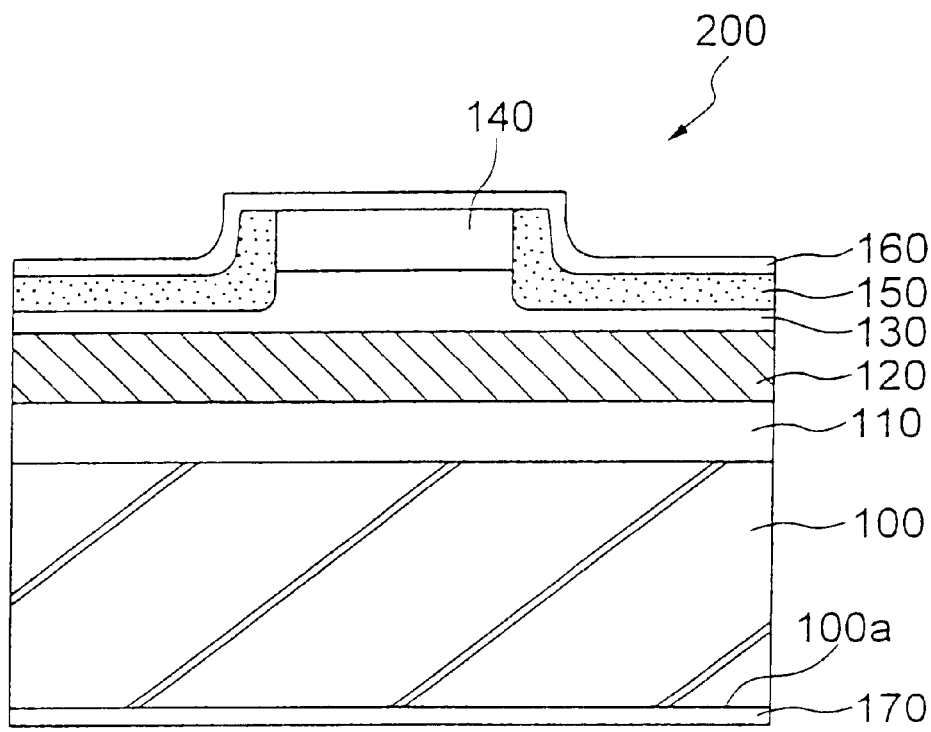
FIG. 6A is a cross sectional view showing a layered structure of a semiconductor laser element in accordance with an embodiment of the present invention.
Figure 6B:
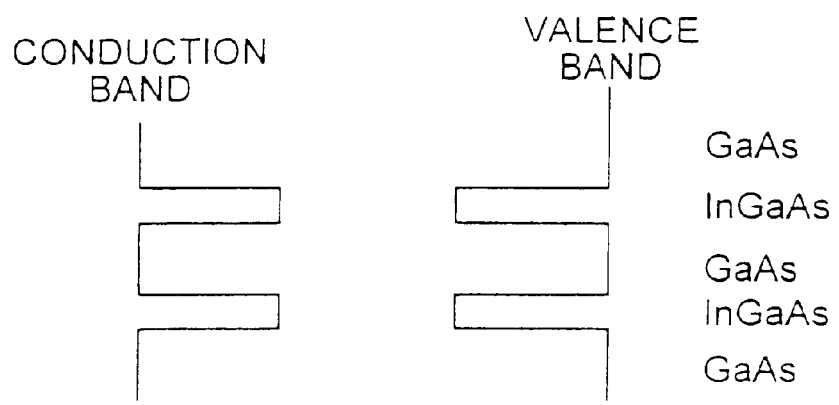
FIG. 6B is a diagram showing a band gap of an active layer of the semiconductor laser element.

In the present embodiment, the InGaAs/GaAs quantum well active layer 120 is formed as a double quantum well structure including a plurality of InGaAs layers and a plurality of GaAs layers alternately disposed as shown in FIG. 6B.

The upper layer by a thickness of 1 μm of the second clad layer 130 and the cap layer 140 are shaped to provide mesa stripes having a width of 4 μm, and a passivation film 150 made of SiN is formed on the entire surface of the cap layer 140 and the cladding layer 130 except for the top surface of the mesa stripe (top surface of the cap layer 140). A window for supplying current therethrough is formed on the top surface of the cap layer 140.

A TiPtAu metal layered film 160 is formed on the passivation film 150 as a p-side electrode, and a AuGe/Ni/Au metal layered film 170 is formed on the bottom surface 100a of the substrate 110 as a n-side electrode.

In the InGaAs-based laser element 200 of the present embodiment, the bottom surface 100a of the substrate 110 is treated to have continuous and minute unevenness in a wave shape thereby performing the diffused reflection of light.

The size of the unevenness is defined by employing surface roughness Rq (root-mean square value of roughness) measured with a differential step contact type surface roughness measuring device. The surface roughness Rq is generally between 10 nm and 10 $\mu$m, and more preferably about 10 nm.

In order to manufacture the InGaAs-based laser element 200 of the present embodiment, similarly to the conventional method, the cladding layer 110, the quantum well active layer 120, the cladding layer 130 and the cap layer 140 are sequentially grown on the substrate 100 employing an MOCVD method followed by the formation of the mesa stripe and the window.

Then, the bottom surface 110a of the substrate 100 is polished until the thickness of the substrate becomes 100 $\mu$m. During the polishing of the present embodiment, lapping powder having a larger particle size is employed for forming the unevenness of which the root-mean square value of roughness "Rq" is around 100 nm on the polished surface.

Thereafter, similarly to the conventional method, the TiPtAu metal layered film 160 functioning as a p-side electrode and the AuGe/Ni/Au metal layered film 170 functioning as a n-side electrode are formed on the passivation film 150 and on the bottom surface 100a of the substrate 100, respectively, by means of vapor deposition to provide the InGaAs-based laser element 200 shown in FIG. 6A.

After a trial piece similar to the semiconductor light emitting device 200 of the present embodiment was manufactured employing lapping powder including particles of which a size was around 9 $\mu$m to make unevenness of which Rq was 100 nm on the bottom surface of a substrate, the current-optical output characteristic and a lasing spectrum of the trial piece were measured. The respective measurement results are shown in FIGS. 7 and 8 which are graphs of a relation between the injected current and the optical output power and the output spectrum, respectively.

Figure 7:
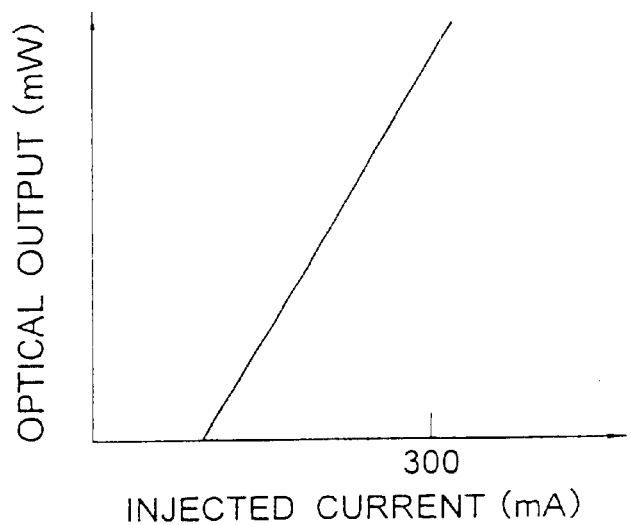
FIG. 7 is a graph showing a relation between injected current and an optical output power of the semiconductor laser element of the embodiment.
Figure 8:
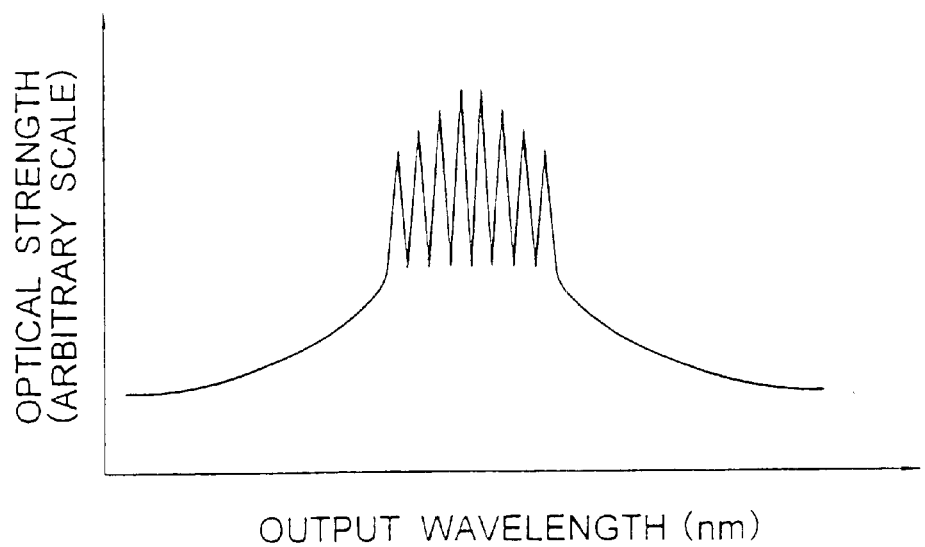
FIG. 8 is a graph showing an output spectrum of the semiconductor laser element of the embodiment.

The current-optical output characteristic shows a linearity having substantially no kinks at least up to 300 mA as shown in FIG. 7. In the lasing spectrum shown in FIG. 8, ripples occurring in the conventional semiconductor laser element are extinguished and the spectrum is lased in the longitudinal multi-mode.

Figure 9:
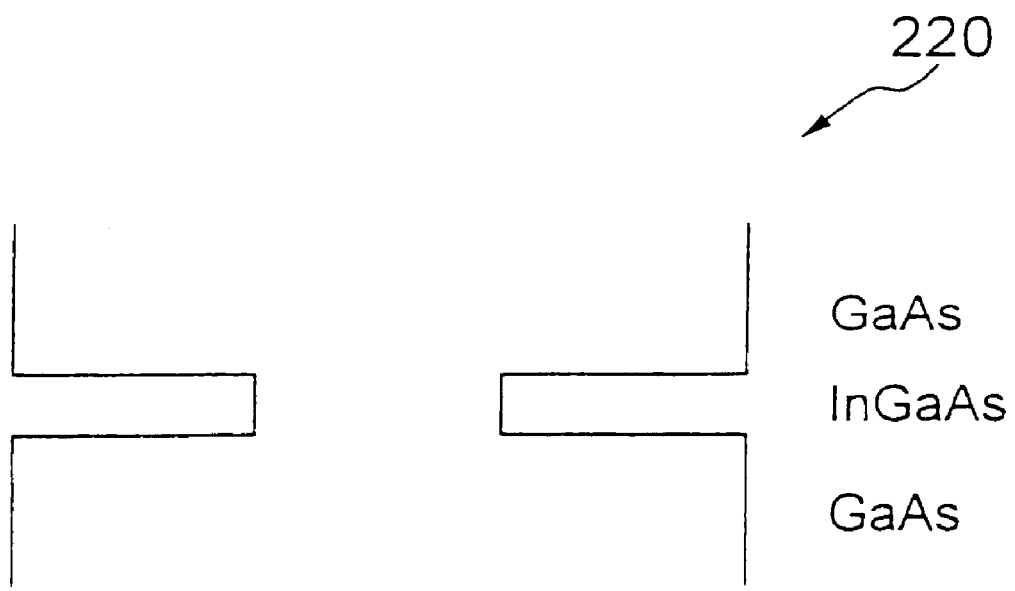
FIG. 9 is a band gap diagram of a modified active layer.

The InGaAs/GaAs quantum well active layer 120 of the present embodiment may be replaced with a single quantum well structure 220 including two GaAs barrier layers and an InGaAs well layer between the barrier layers as shown in FIG. 9 The single quantum well structure can generate more stable multiple longitudinal mode lasing.

Since the above embodiments are described only for examples, the present invention is not limited to the above embodiments and various modifications or alternations can be easily made therefrom by those skilled in the art without departing from the scope of the present invention.

What is claimed is:

1. A semiconductor laser device for the emission of light having a discrete wavelength and for the obtainment of a multiple longitudinal mode lasing spectrum and a stable optical output with respect to injected current, said semiconductor laser device comprising a semiconductor substrate having a bandgap energy of $Eg_1$, and at least one active layer having a bandgap energy of $Eg_2$ small than $Eg_1$ and overlying main surface of the semiconductor substrate, a bottom surface of the semiconductor substrate opposite to the main surface having unevenness for diffused reflection.

2. The semiconductor laser device as defined in claim 1, wherein the depth of the unevenness is such that a root-mean square value of roughness "Rq" thereof is between 10 nm and 10 $\mu$m both inclusive.

3. The semiconductor laser device as defined in claim 1, wherein said at least one active layer implements a single quantum well layer.

4. The semiconductor laser device as defined in claim 1, wherein said unevenness further comprises a continuous and minute unevenness in a wave shape.

5. The semiconductor laser device as defined in claim 2, wherein said unevenness further comprises a continuous and minute unevenness in a wave shape.

6. The semiconductor laser device as defined in claim 3, wherein said unevenness further comprises a continuous and minute unevenness in a wave shape.

7. The semiconductor laser device as defined in claim 1, wherein said bottom surface further comprises a non-grooved surface.

* * * * *